(12) United States Patent
Wagoner et al.

(10) Patent No.: US 10,638,648 B2
(45) Date of Patent: Apr. 28, 2020

(54) COOLING SYSTEM WITH PRESSURE REGULATION

(71) Applicant: GE Energy Power Conversion Technology Ltd., Warwickshire (GB)

(72) Inventors: Robert Gregory Wagoner, Salem, VA (US); Steven Wade Sutherland, Salem, VA (US); Winston Lei Zeng, Salem, VA (US); Mark Aaron Chan, Garching b. Munchen (DE)

(73) Assignee: GE ENERGY POWER CONVERSION TECHNOLOGY LTD., Warwickshire (GB)

( * ) Notice: Subject to any disclaimer, the term of this patent is extended or adjusted under 35 U.S.C. 154(b) by 529 days.

(21) Appl. No.: 15/140,541

(22) Filed: Apr. 28, 2016

(65) Prior Publication Data

US 2017/0318711 A1    Nov. 2, 2017

(51) Int. Cl.
    *H05K 7/20* (2006.01)
(52) U.S. Cl.
    CPC ..... *H05K 7/20945* (2013.01); *H05K 7/20318* (2013.01); *H05K 7/20936* (2013.01)
(58) Field of Classification Search
    CPC .................................................. H05K 7/20945
    USPC ......................................................... 236/92 R
    See application file for complete search history.

(56) References Cited

U.S. PATENT DOCUMENTS

| | | | |
|---|---|---|---|
| 4,614,087 A * | 9/1986 | Nadamoto | B60H 1/3225 62/126 |
| 5,441,103 A * | 8/1995 | Rezkallah | F24F 12/002 165/104.29 |
| 6,152,215 A | 11/2000 | Niggemann | |
| 6,498,725 B2 | 12/2002 | Cole et al. | |
| 6,536,510 B2 | 3/2003 | Khrustalev et al. | |
| 6,571,569 B1 | 6/2003 | Rini et al. | |
| 6,772,603 B2 | 8/2004 | Hsu et al. | |
| 6,804,117 B2 | 10/2004 | Phillips et al. | |
| 6,993,924 B2 | 2/2006 | Hsu et al. | |
| 6,993,926 B2 | 2/2006 | Rini et al. | |
| 7,013,955 B2 | 3/2006 | Phillips et al. | |
| 7,143,598 B2 | 12/2006 | Feger et al. | |
| 7,231,961 B2 | 6/2007 | Alex et al. | |
| 7,266,969 B2 | 9/2007 | Hsu et al. | |
| 7,273,357 B2 | 9/2007 | Hattori et al. | |
| 7,848,624 B1 | 12/2010 | Zimbeck et al. | |
| 7,958,935 B2 | 6/2011 | Belits et al. | |

(Continued)

FOREIGN PATENT DOCUMENTS

| | | |
|---|---|---|
| EP | 1863085 A2 | 12/2007 |
| EP | 2284846 A1 | 2/2011 |

(Continued)

OTHER PUBLICATIONS

GE Related Case Form.
Wagoner et al., filed Nov. 3, 2014, U.S. Appl. No. 14/531,128.
Waddell et al., filed Aug. 8, 2016, U.S. Appl. No. 15/231,136.

*Primary Examiner* — Henry T Crenshaw
(74) *Attorney, Agent, or Firm* — Wood IP LLC

(57) ABSTRACT

Provided are systems and methods for cooling a power converter. For example, there is provided a controller programmed to control a heat transport rate between a coolant disposed in a cooling system and a power converter coupled thereto by regulating a pressure of the coolant in the cooling system.

9 Claims, 3 Drawing Sheets

(56) References Cited

U.S. PATENT DOCUMENTS

| | | | |
|---|---|---|---|
| 8,056,615 B2 | 11/2011 | Downing | |
| 8,286,439 B2 | 10/2012 | Wu et al. | |
| 8,322,154 B2* | 12/2012 | Campbell | F28D 15/0266 165/104.21 |
| 8,976,526 B2 | 3/2015 | Kulkarni et al. | |
| 9,032,743 B2 | 5/2015 | Agostini et al. | |
| 9,097,467 B2 | 8/2015 | Gradinger et al. | |
| 2002/0068422 A1* | 6/2002 | Dairiki | H01L 21/2686 438/530 |
| 2003/0075567 A1* | 4/2003 | Santagiuliana | B05B 11/0094 222/380 |
| 2005/0103487 A1 | 5/2005 | Aflekt et al. | |
| 2007/0193721 A1* | 8/2007 | Tilton | F25B 43/04 165/104.19 |
| 2008/0060371 A1 | 3/2008 | Jude | |
| 2008/0179047 A1 | 7/2008 | Yesin et al. | |
| 2009/0056916 A1 | 3/2009 | Yesin et al. | |
| 2010/0089461 A1* | 4/2010 | Weber | F25B 43/04 137/13 |
| 2010/0232110 A1* | 9/2010 | Ippoushi | F25B 39/02 361/699 |
| 2010/0263885 A1* | 10/2010 | Tuma | A62C 3/16 169/46 |
| 2012/0024500 A1 | 2/2012 | Ng et al. | |
| 2012/0067558 A1 | 3/2012 | Phan et al. | |
| 2012/0085114 A1 | 4/2012 | Graaf et al. | |
| 2012/0087088 A1 | 4/2012 | Killion et al. | |
| 2012/0133152 A1* | 5/2012 | Wagoner | F03D 80/60 290/1 B |
| 2012/0186290 A1 | 7/2012 | Howes et al. | |
| 2012/0227429 A1 | 9/2012 | Louvar et al. | |
| 2012/0312037 A1 | 12/2012 | Finney et al. | |
| 2012/0324933 A1 | 12/2012 | Louvar et al. | |
| 2013/0125566 A1 | 5/2013 | Grefe | |
| 2013/0312937 A1* | 11/2013 | Tsukinari | H01L 23/427 165/104.21 |
| 2014/0020415 A1 | 1/2014 | Heyl | |
| 2014/0076522 A1 | 3/2014 | Olesen | |
| 2014/0137582 A1 | 5/2014 | Louvar et al. | |
| 2014/0190189 A1 | 7/2014 | Kowsky et al. | |
| 2014/0196498 A1 | 7/2014 | Xiao et al. | |
| 2014/0251585 A1 | 9/2014 | Kusuda et al. | |
| 2014/0252864 A1 | 9/2014 | Kulkarni et al. | |
| 2014/0305153 A1* | 10/2014 | Arai | H05K 7/20936 62/190 |
| 2014/0331704 A1* | 11/2014 | Kondrk | F16K 17/0413 62/190 |
| 2015/0001349 A1* | 1/2015 | Figus | B64G 1/10 244/171.8 |
| 2015/0003015 A1 | 1/2015 | Kulkarni et al. | |
| 2015/0075184 A1 | 3/2015 | Edwards et al. | |
| 2015/0241094 A1 | 8/2015 | Blomberg et al. | |
| 2016/0128231 A1 | 5/2016 | Wagoner et al. | |
| 2016/0278239 A1* | 9/2016 | Chainer | H05K 7/20354 |
| 2017/0101919 A1* | 4/2017 | Sato | F01P 3/2285 |

FOREIGN PATENT DOCUMENTS

| | | |
|---|---|---|
| JP | 2015-229975 | * 12/2015 |
| WO | 0070289 A1 | 11/2000 |
| WO | 03063241 A2 | 7/2003 |
| WO | 2010099545 A1 | 9/2010 |
| WO | 2011044445 A1 | 4/2011 |
| WO | 2012131709 A1 | 10/2012 |
| WO | 2013023279 A1 | 2/2013 |
| WO | 2014048680 A1 | 4/2014 |
| WO | 2014143621 A1 | 9/2014 |
| WO | 2017200551 A1 | 11/2017 |

* cited by examiner

COOLING SYSTEM WITH PRESSURE REGULATION

TECHNICAL FIELD

The present disclosure relates to cooling systems. More particularly, the present disclosure relates to cooling systems with pressure regulation.

BACKGROUND

In a wind turbine system, heat transfer between a power converter and a coolant typically occurs by advection as a result of the temperature differential that inherently exists in the system. Specifically, heat from the power converter is transferred to the circulating coolant, transforming it to its vapor phase. The heat is then extracted from the coolant vapor, which causes it to condense and turn back into its liquid phase. A coolant having a boiling point equal to or lower than the power converter's operating temperature is chosen in order to allow the above-described heat exchange cycle to happen.

SUMMARY

The embodiments featured herein help solve or mitigate deficiencies of typical cooling systems.

One embodiment includes a method for cooling a power converter. The method can include controlling a heat transport rate between the power converter and a coolant by regulating a pressure of the coolant. Another embodiment includes a system for cooling a power converter. The system can include a controller programmed to control a heat transport rate between a coolant and the power converter by regulating a pressure of the coolant.

Additional features, modes of operations, advantages, and other aspects of various embodiments are described below with reference to the accompanying drawings. It is noted that the present disclosure is not limited to the specific embodiments described herein. These embodiments are presented for illustrative purposes. Additional embodiments, or modifications of the embodiments disclosed, will be readily apparent to persons skilled in the relevant art(s) based on the teachings provided

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
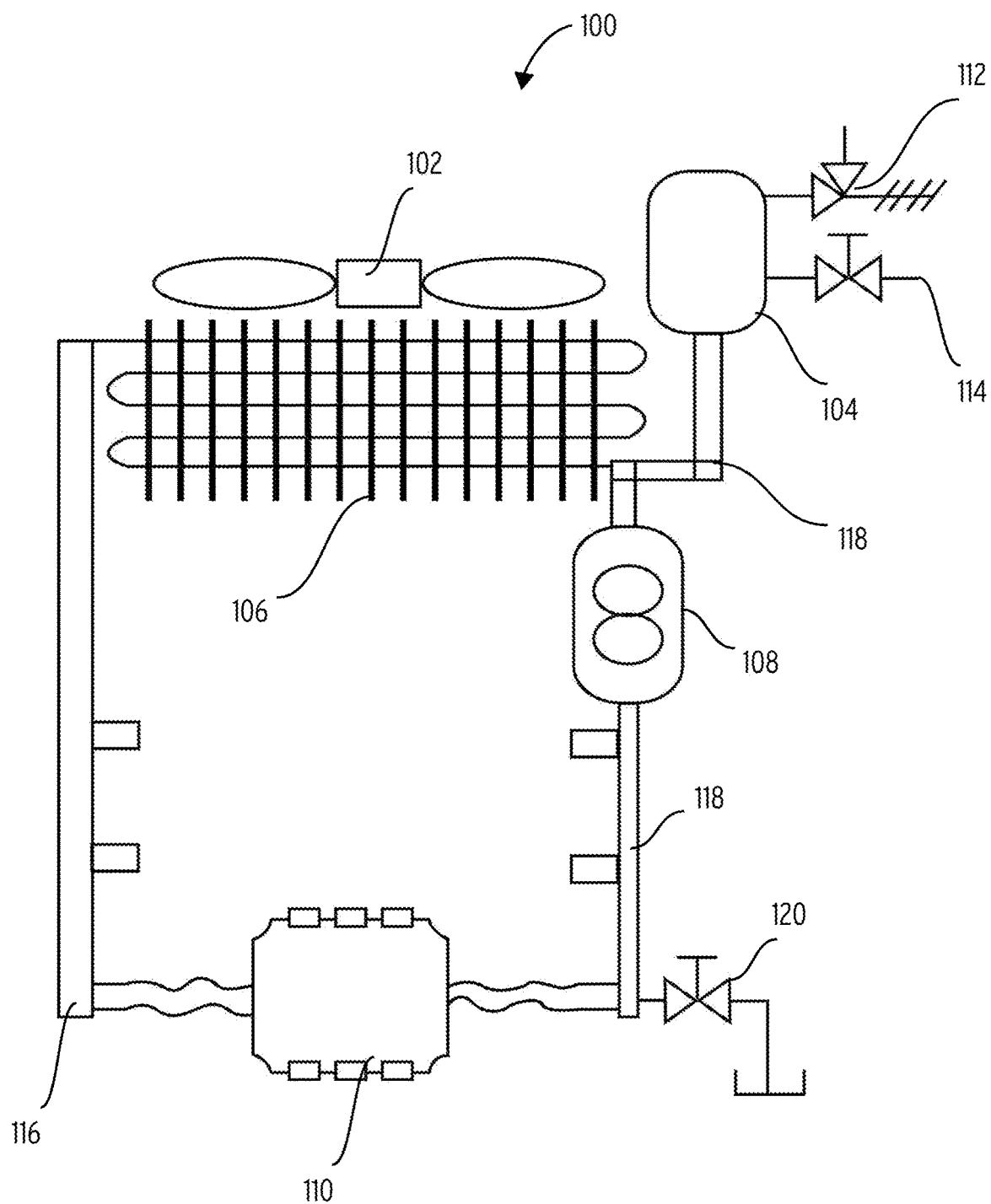
FIG. 1 is an illustration of a cooling system, according to an embodiment.

FIG. 1 shows a cooling system 100, according to an embodiment. Cooling system 100 includes a fan 102 coupled to a condenser 106, and an evaporator 110 disposed in series with condenser 106 via a set of conduits (i.e. conduit 116 and conduit 118) through which a coolant flows. For example, during operation, a coolant is accumulated in accumulator 104 via a charging port 114. Accumulator 104 can have a level indicator and a level sensor to provide information relating to the amount of coolant that is included in the system.

During operation, the coolant flows in liquid phase through conduit 118, which is equipped with a flow meter 108. The pressure in conduit 118 and accumulator 104 can be adjusted via pressure relief port 112. The coolant then goes through evaporator 110, which causes it to boil and enter its vapor phase. As such, the coolant flows through conduit 116 in its vapor phase, at which point it enters condenser 106. Heat can be extracted from the coolant vapor via a fan 102, at which point it returns to its liquid phase and re-enters conduit 118. Cooling system 100 can increase the coolant's pressure, which effectively increases the coolant's boiling point and leads to lower latent heat and higher exit quality at evaporator 110.

Evaporator 110 can be a heat sink that is coupled to a power converter circuit of a wind turbine system. The coolant can be chosen so that the operating temperature of the power converter circuit causes the coolant to boil once it goes through evaporator 110. The difference in temperature at evaporator 110 (which is hot) and condenser 106 (which is relatively colder) causes the coolant to flow continuously through conduit 116 and conduit 118 without the use of a pump.

In one embodiment, the coolant's pressure in cooling system 100 can be varied by adjusting pressure relief port 112. The pressure can be controlled using pressure sensors disposed along any one conduit of the system and using a closed loop feedback controller. For example, a target pressure may be set for a given coolant, and the pressure can be varied in a closed loop that continually senses the pressure in the conduits and adjusts the pressure at pressure relief port 112. Specifically, the absolute pressure in cooling system 100 can be adjusted by controlling the volumetric expansion and/or volumetric contraction of a bellow coupled to pressure relief port 112 and accumulator 104.

Pressure relief port 112 can be a means of altering the absolute pressure in cooling system 100. Specifically, when the coolant has a positive pressure over the ambient and there are non-condensable gases in the cooling system, pressure relief port 112 can be utilized to expel unwanted non-condensable gases cooling system 100, allowing more surface area of the condenser to be accessed for heat transfer by the coolant vapor.

Depending on the amount of non-condensable gas expelled, the corresponding partial pressure of the remaining non-condensable gas is reduced, which leads to lowering the boiling point of the coolant. A lower boiling point will be useful in the event of very low temperature start up and will avoid an abrupt increase in the temperature of the cooling system or the power electronics that could be detrimental to the power electronics reliability.

One of skill in the art will readily recognize how actuators and sensors can be used in the context of the present disclosure to adaptively adjust the pressure based on a pressure and/or coolant flow or flow rate measured in the system. In some embodiments, the absolute pressure of the coolant can be measured.

In another embodiment, inert vapor can be inserted into cooling system 100 to increase an area of condenser 106 that gets exposed to the vapor phase of the coolant, thereby extracting even more heat from the coolant. The inert vapor can thus be used as an alternative (or as an additional means) to adjust the pressure of the coolant. The inert vapor can be helium or argon, or a combination thereof. Generally speaking, any inert gas can be used to effectively adjust the pressure in cooling system 100.

Cooling system 100 can include a controller (shown in FIG. 3) that can interface with its various sensors and actuators to provide a closed control loop. For example, the controller can interface with electro-mechanical actuators that can actuate pressure relief port 112 and port 120. Furthermore, the controller can interface with flow meter 108 and/or pressure sensors disposed throughout the system to regulate coolant pressure.

In some embodiments, pressure regulation can be accomplished passively by a simple mechanical spring-loaded pressure control valve or a spring-loaded volumetric expansion device such as a cylinder. In this mechanical pressure control system, when vapor pressure increases, the system's overall pressure increases, thus pushing the spring up to increase the pressure in accumulator 104.

Higher pressures will lead to higher vaporization points, which means that more liquid state coolant will take part in the heat transfer, thereby increasing the heat transfer rate. In embodiments that use a volumetric expansion device, the expansion volume is configured to store un-condensable air to enable better condensing performance and therefore to achieve a better heat transfer rate for the entire system.

Furthermore, in some embodiments, controls can be included in cooling system 100 to operate it at a level (i.e. flow rate, pressure, and temperature) that maximizes heat transfer, thereby minimizing the thermal resistance between the power converter circuit and the cooling system. In these embodiments, pressure and temperature sensors can provide input to a controller that adjusts the pressure in a closed control loop as described above. The maximum heat transport rate achievable can be found adaptively (i.e. finding, with the controller, a set pressure in which the rate of change of heat transport rate is zero). Alternatively, the maximum heat transport rate achievable can be found based on a pre-determined pressure versus heat transport rate calibration curve for cooling system 100, and the pressure can be adjusted accordingly.

Figure 2:
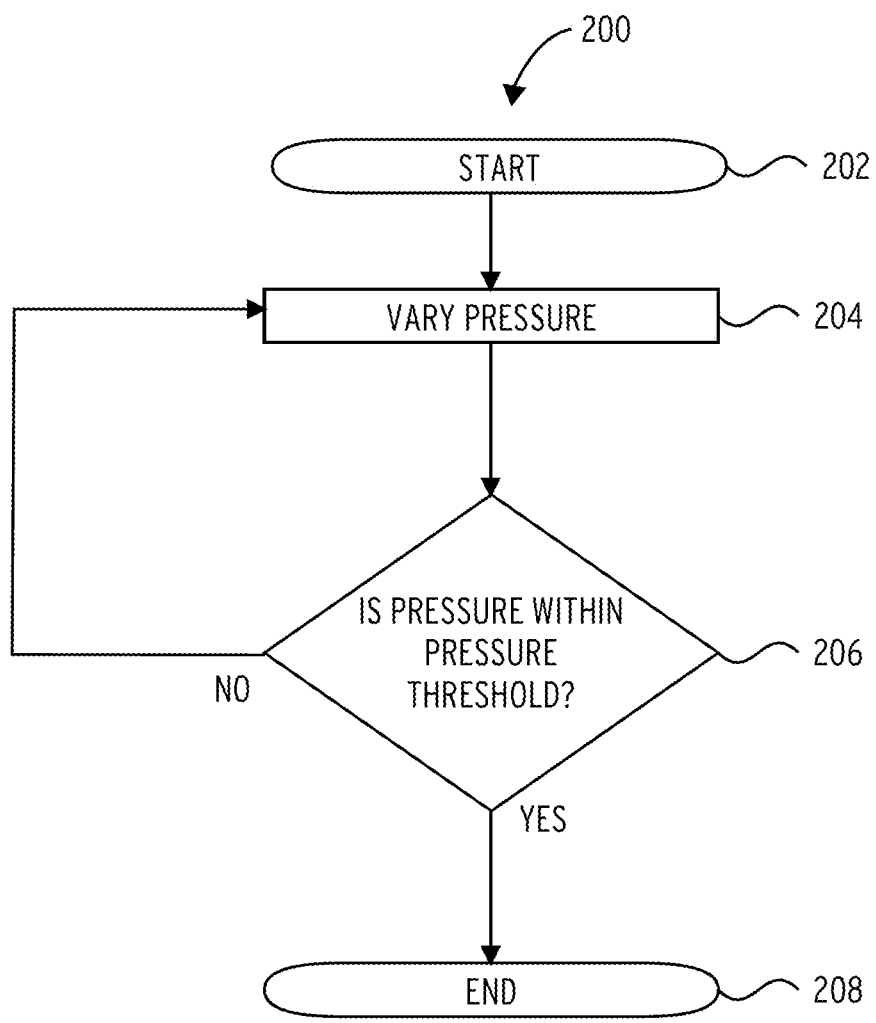
FIG. 2 is an illustration of a method, according to an embodiment.

FIG. 2 depicts a flow chart of a method 200, according to an embodiment. Method 200 begins at block 202 and includes varying the pressure of a coolant in a cooling system such as the one described in FIG. 1. Method 200 can be used for cooling a power converter included in a wind turbine system, for example. Method 200 can include controlling a heat transport rate between the power converter and a coolant by regulating, i.e. by varying, the pressure of the coolant (see block 204).

As shown in FIG. 2, regulating the pressure of the coolant may include varying the pressure in a closed control loop. The closed control loop includes measuring the pressure of the coolant and checking whether the measured pressure is within a predetermined pressure threshold (decision block 206). If the measured pressure is within the predetermined threshold, e.g. by a predetermined error percentage from a nominal value, method 200 ends at block 208. Otherwise, method 200 includes further varying the pressure at block 204, until the measured pressure is within the predetermined threshold. Other threshold methods are contemplate. Specifically, other parameters may be used for control, and method 200 can include simply checking whether the measured parameter exceeds a predetermined threshold, for example.

In some embodiments, method 200 can include regulating the pressure by altering the pressure of the coolant in its vapor phase or in its liquid phase. Altering the pressure of the coolant in vapor phase may include controlling one of (i) a volumetric expansion of the coolant and (ii) a volumetric contraction of the coolant. As previously discussed, this can be achieved by actuating a bellow (see FIG. 1).

In yet other embodiments, varying the pressure can be achieved by adding inert vapor in the cooling system to effectively adjust an area of the condenser that is exposed to the vapor phase of the coolant. The inert vapor can include helium or argon. Generally speaking, the inert vapor can be an inert gas. Furthermore, in some embodiments, the inert vapor can be at least one of helium and argon.

While method 200 shows a pressure threshold as being a control parameter for the control loop, one of ordinary skill in the art will readily recognize that any control parameter can be used. For example, a predetermined/desired heat transport rate across a heat sink (like evaporator 110 in FIG. 1) can be used as a parameter for a controller. A temperature sensor can thus be used to provide temperature data to the controller which then estimates the heat transport rate and adjusts the pressure to arrive at the predetermined heat transport rate. Generally speaking, regulating the pressure may include altering the pressure until a predetermined heat transport rate is achieved. Other control parameters for the closed control loop can be, for example, a predetermined thermal resistance at evaporator 110.

In yet other embodiments, controlling the heat transport rate by varying the pressure can be achieved mechanically. Specifically, method 200 can include mechanically adjusting a spring-loaded pressure control system to regulate the pressure.

Figure 3:
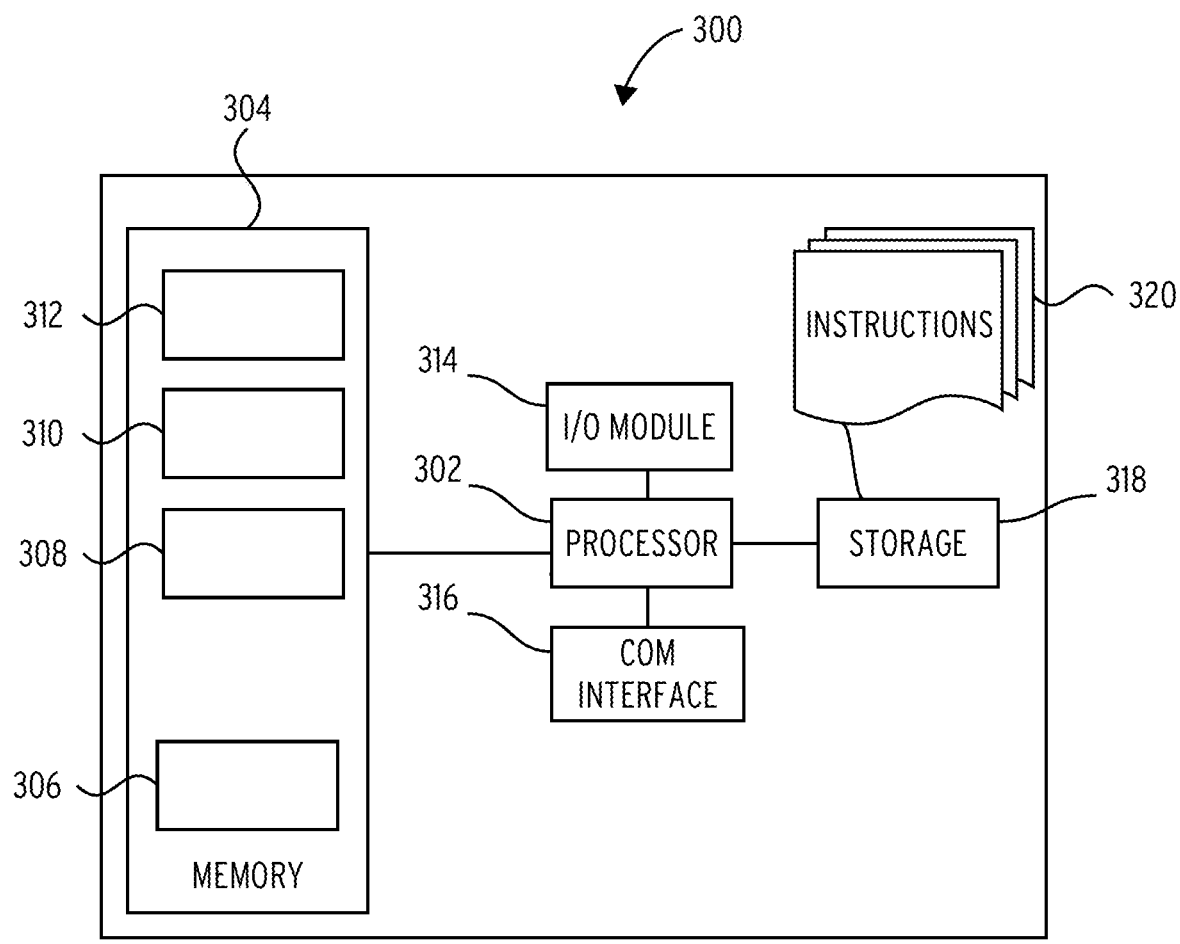
FIG. 3 is a block diagram of a controller, according to an embodiment.

Having set forth various exemplary embodiments, a controller 300 (or system) consistent with their operation is now described. FIG. 3 shows a block diagram of a controller 300, which can include a processor 302 that has a specific structure. The specific structure is imparted to processor 302 by instructions stored in a memory 304 included therein and/or by instructions 320 that can be fetched by processor 302 from a storage medium 318. The storage medium 318 may be co-located with controller 300 as shown, or it may be located elsewhere and be communicatively coupled to controller 300.

Controller 300 can be a stand-alone programmable system, or it can be a programmable module located in a much larger system. For example, controller 300 can be part of a cooling system like the one shown in FIG. 1.

Controller 300 may include one or more hardware and/or software components configured to fetch, decode, execute, store, analyze, distribute, evaluate, and/or categorize information. Furthermore, controller 300 can include an input/output (I/O) module 314 that is configured to interface with a plurality of sensors, like pressure sensors, flow sensors, and temperature sensors. Furthermore, controller 300 can interface with a plurality of actuators that are included in the cooling system or that are associated with it. Such actuators may be, for example, valves, mass flow controllers for controlling inert vapor delivery and/or to achieve predetermined flow rates.

Processor 302 may include one or more processing devices or cores (not shown). In some embodiments, processor 302 may be a plurality of processors, each having either one or more cores. Processor 302 can be configured to execute instructions fetched from memory 304, i.e. from one of memory block 312, memory block 310, memory block 308, or memory block 306, or the instructions may be fetched from storage medium 318, or from a remote device connected to controller 300 via communication interface 316.

Furthermore, without loss of generality, storage medium 318 and/or memory 304 may include a volatile or non-volatile, magnetic, semiconductor, tape, optical, removable, non-removable, read-only, random-access, or any type of non-transitory computer-readable medium. Storage medium 318 and/or memory 304 may include programs and/or other information that may be used by processor 302. Furthermore, storage medium 318 may be configured to log data processed, recorded, or collected during the operation of controller 300. The data may be time-stamped, location-stamped, cataloged, indexed, or organized in a variety of ways consistent with data storage practice.

In one embodiment, memory block 306 may include instructions that, when executed by processor 302, cause processor 302 to perform certain operations. The operations can include controlling a heat transport rate between a coolant and a power converter by regulating a pressure of the coolant. The pressure can be an absolute pressure of the coolant.

Regulating the pressure can be done according to a closed control loop, as described above. The operations can include receiving (i) signals from pressure and temperature sensors disposed to in the cooling system and (ii) causing the processor to issue control signals that regulate the pressure based on the received sensor signals.

For example, the operations can include controlling at least one of a volumetric expansion and a volumetric contraction of the coolant in vapor phase by issuing control signals that cause the actuation of a bellow. In yet other embodiments, the operations can include issuing control signals that control a flow of an inert vapor into the cooling system. The inert vapor can include helium or argon. Generally speaking, the inert vapor can be an inert gas.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A system for cooling a power converter, comprising:
a fan coupled to a condenser located at a first end of the system, the condenser being coupled in series to an evaporator via a first conduit through which a coolant flows, the coolant being in vapor form;
the evaporator coupled to a second conduit through which the coolant flows, the coolant being in liquid form, the second conduit coupling the evaporator to an accumulator located at a second end of the system;
the accumulator coupled to a pressure relief port configured to adjust a pressure of the coolant in system; and
a controller operatively coupled to the pressure relief port and configured to control the pressure relief port;
wherein, the controller is programmed to control a heat transport rate between the coolant and the power converter by regulating the pressure of the coolant.

2. The system of claim 1, wherein the controller is programmed to regulate the pressure according to a closed control loop.

3. The system of claim 1, wherein the controller is programmed to (i) receive signals from at least one sensor disposed in the system and (ii) regulate the pressure based on the signals.

4. The system of claim 1, wherein the controller is programmed to control at least one of a volumetric expansion and a volumetric contraction of the coolant in vapor phase.

5. The system of claim 1, wherein the controller is programmed to control a flow of an inert vapor into the system.

6. The system of claim 5, wherein the inert vapor includes at least one of helium and argon.

7. The system of claim 1, wherein the controller is programmed to regulate the pressure until a predetermined heat transport rate is achieved.

8. The system of claim 1, wherein the controller is programmed to regulate the pressure until a predetermined thermal resistance is achieved.

9. The system of claim 1, wherein the controller is configured to regulate an absolute pressure of the coolant.

* * * * *